(12) United States Patent
Landru et al.

(10) Patent No.: US 11,876,015 B2
(45) Date of Patent: *Jan. 16, 2024

(54) METHOD FOR TRANSFERRING A USEFUL LAYER TO A CARRIER SUBSTRATE

(71) Applicant: Soitec, Bernin (FR)

(72) Inventors: Didier Landru, Le Champ-près-Froges (FR); Oleg Kononchuk, Theys (FR); Nadia Ben Mohamed, Echirolles (FR); Franck Colas, Tencin (FR)

(73) Assignee: Soitec, Bernin (FR)

( * ) Notice: Subject to any disclaimer, the term of this patent is extended or adjusted under 35 U.S.C. 154(b) by 211 days.

This patent is subject to a terminal disclaimer.

(21) Appl. No.: 17/435,631

(22) PCT Filed: Feb. 26, 2020

(86) PCT No.: PCT/FR2020/050369
§ 371 (c)(1),
(2) Date: Sep. 1, 2021

(87) PCT Pub. No.: WO2020/188169
PCT Pub. Date: Sep. 24, 2020

(65) Prior Publication Data
US 2022/0157650 A1    May 19, 2022

(30) Foreign Application Priority Data
Mar. 15, 2019   (FR) ...................................... 1902674

(51) Int. Cl.
*H01L 21/762* (2006.01)
*H01L 21/78* (2006.01)
*H01L 21/304* (2006.01)

(52) U.S. Cl.
CPC .... *H01L 21/76254* (2013.01); *H01L 21/3043* (2013.01); *H01L 21/7806* (2013.01)

(58) Field of Classification Search
CPC .......... H01L 21/76254; H01L 21/2007; H01L 21/265; H01L 21/302; H01L 21/304;
(Continued)

(56) References Cited

U.S. PATENT DOCUMENTS

| 2007/0281445 A1* | 12/2007 | Nguyen | ............ H01L 21/76254 |
| | | | 257/E21.237 |
| 2013/0292691 A1 | 11/2013 | Henley et al. | |
| 2015/0303098 A1* | 10/2015 | Landru | ............... H01L 21/6835 |
| | | | 438/458 |

FOREIGN PATENT DOCUMENTS

| EP | 2933828 B1 | 10/2015 |
| WO | 2005/043615 A1 | 3/2005 |
| WO | 2005/043616 A1 | 3/2005 |

OTHER PUBLICATIONS

International Search Report for International Application No. PCT/FR2020/050369 dated Jul. 28, 2020, 2 pages.

(Continued)

*Primary Examiner* — Cheung Lee
(74) *Attorney, Agent, or Firm* — TraskBritt (57) ABSTRACT

A method for transferring a useful layer to a carrier substrate comprises: joining a front face of a donor substrate to a carrier substrate along a bonding interface to form a bonded structure; annealing the bonded structure to apply a weakening thermal budget thereto and bring a buried weakened plane in the donor substrate to a defined level of weakening, the anneal reaching a maximum hold temperature; and initiating a self-sustained and propagating splitting wave in the buried weakened plane by applying a stress to the bonded structure to lead to the useful layer being transferred to the carrier substrate. The initiation of the splitting wave occurs when the bonded structure experiences a thermal gradient defining a hot region and a cool region of the bonded structure, the stress being applied locally in the cool (Continued)

region, and the hot region experiencing a temperature lower than the maximum hold temperature.

18 Claims, 6 Drawing Sheets

(58) Field of Classification Search
CPC ............. H01L 21/3043; H01L 21/3213; H01L 21/32131; H01L 21/76251; H01L 21/78; H01L 21/7806; H01L 21/7813
USPC ........................................................ 438/458
See application file for complete search history.

(56) References Cited

OTHER PUBLICATIONS

International Written Opinion for International Application No. PCT/FR2020/050369 dated Jul. 28, 2020, 5 pages.

* cited by examiner

METHOD FOR TRANSFERRING A USEFUL LAYER TO A CARRIER SUBSTRATE

CROSS-REFERENCE TO RELATED APPLICATIONS

This application is a national phase entry under 35 U.S.C. § 371 of International Patent Application PCT/FR2020/050369, filed Feb. 26, 2020, designating the United States of America and published as International Patent Publication WO 2020/188169 A1 on Sep. 24, 2020, which claims the benefit under Article 8 of the Patent Cooperation Treaty to French Patent Application Serial No. 1902674, filed Mar. 15, 2019.

TECHNICAL FIELD

The present disclosure relates to the field of microelectronics. In particular, the present disclosure relates to a process for transferring a useful layer to a carrier substrate.

BACKGROUND

Figure 1:
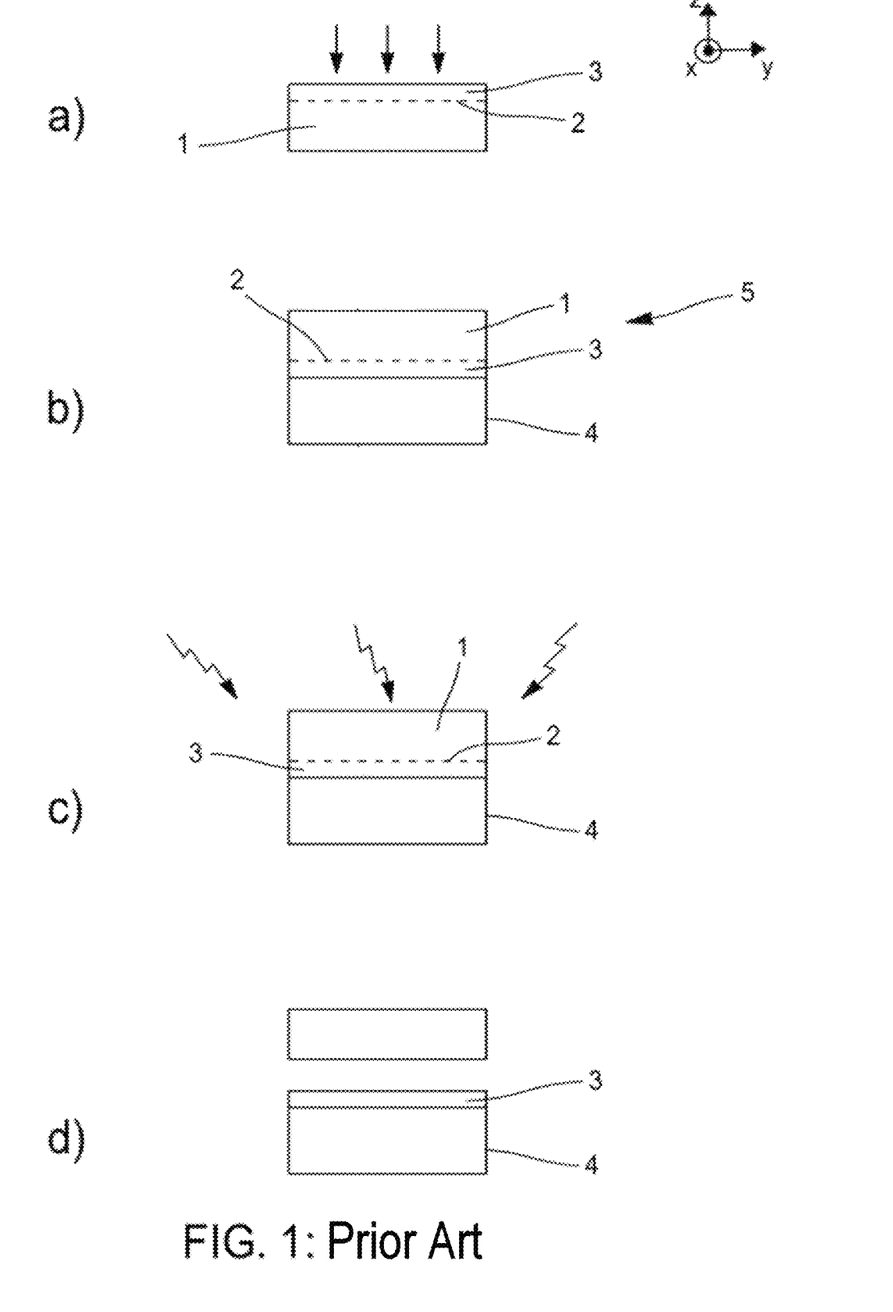
FIG. 1 shows a process for transferring a thin layer according to the prior art.

A process for transferring a useful layer 3 to a carrier substrate 4, shown in FIG. 1, is known from the prior art; this process, described, in particular, in documents WO2005043615 and WO2005043616 and referred to as the "SMART CUT™" process, comprises the following steps:
  forming a buried weakened plane 2 by implanting light species into a donor substrate 1 so as to form a useful layer 3 between this plane and a surface of the donor substrate;
  next, joining the donor substrate 1 to a carrier substrate 4 to form a bonded structure 5;
  then applying a heat treatment to the bonded structure 5 in order to weaken the buried weakened plane;
  and lastly, initiating a splitting wave, with self-sustained propagation of the splitting wave in the donor substrate 1 along the buried weakened plane 2.

In this process, the species implanted at the level of the buried weakened layer 2 initiate the development of microcavities. The weakening heat treatment has the effect of promoting the growth and pressurization of these microcavities. By applying additional outside forces (energy pulse) after the heat treatment, a splitting wave is initiated in the buried weakened layer 2, which wave propagates in a self-sustained manner, resulting in the useful layer 3 being transferred through detachment at the level of the buried weakened plane 2. Such a process makes it possible, in particular, to decrease the roughness of the surface after transfer.

This process may be used to produce silicon-on-insulator (SOI) substrates. In this case, the donor substrate 1 and the carrier substrate 4 are each formed of a silicon wafer, the standard diameter of which is typically 200 mm, 300 mm or 450 mm for later generations. Either or both of the donor substrate 1 and the carrier substrate 4 are surface-oxidized.

SOI substrates must comply with very stringent specifications. This is particularly the case for the average thickness and the uniformity of thickness of the useful layer 3. Complying with these specifications is necessary for the semiconductor devices that will be formed in and on this useful layer 3 to operate correctly.

In some cases, the architecture of these semiconductor devices requires arranging SOI substrates exhibiting a very low average thickness of the useful layer 3, for example, lower than 50 nm, and exhibiting very high uniformity of thickness for the useful layer 3. The expected uniformity of thickness may be about 5% at most, corresponding to variations typically from +/−0.3 nm to +/−1 nm over the entire surface of the useful layer 3. Even if additional finishing steps, such as etches or surface-smoothing heat treatments, are carried out after the useful layer 3 has been transferred to the carrier substrate 4, it is important for the morphological surface properties (in particular, uniformity of thickness and surface roughness) to be as favorable as possible after transfer in order to ensure that the end specifications are met.

The applicant has observed that, when the splitting wave is initiated after the heat treatment at ambient temperature by applying an energy pulse to the buried weakened plane 2, some useful layers 3 may include, after transfer, marbling-like irregular patterns due to local variations in thickness, the amplitude of which is about a nanometer or half a nanometer. This marbling may be distributed over the entirety of the useful layer 3, or over only a portion thereof. It contributes to the non-uniformity of the useful layer 3.

This type of non-uniformity in the thickness of the useful layer 3 is very difficult to eliminate using the typical finishing techniques (etching, sacrificial oxidation, smoothing heat treatment, etc.) because these techniques are not effective in erasing irregular patterns of this amplitude.

BRIEF SUMMARY

The present disclosure relates to a process for transferring a useful layer to a carrier substrate and aims, in particular, to improve the uniformity of thickness of the transferred useful layers.

The present disclosure relates to a process for transferring a useful layer to a carrier substrate, comprising the following steps:
  a) providing a donor substrate including a buried weakened plane, the useful layer being delimited by a front face of the donor substrate and the buried weakened plane;
  b) providing a carrier substrate;
  c) joining the donor substrate, by its front face, to the carrier substrate along a bonding interface so as to form a bonded structure;
  d) annealing the bonded structure in order to apply a weakening thermal budget thereto and to bring the buried weakened plane to a defined level of weakening, the anneal reaching a maximum hold temperature; and
  e) initiating a splitting wave in the buried weakened plane by applying a stress to the bonded structure, the splitting wave propagating in a self-sustained manner along the buried weakened plane in order to result in the useful layer being transferred to the carrier substrate.

The transfer process is noteworthy in that the initiation in step e) takes place when the bonded structure is experiencing a thermal gradient defining a hot region and a cool region of the bonded structure, the stress being applied locally in the cool region, and the hot region experiencing a temperature lower than the maximum hold temperature.

According to other advantageous and non-limiting features of the present disclosure, taken alone or in any technically feasible combinations:
  the thermal gradient is chosen to be between 20° C. and 100° C., preferably, between 60° C. and 90° C., more preferably, about 80° C.;
  the maximum hold temperature is between 300° C. and 600° C.;

annealing step d) takes place in a heat treatment apparatus and the initiation in step e) takes place when the bonded structure exits the heat treatment apparatus;

the heat treatment apparatus is a horizontally or vertically configured oven, suitable for batch-treating a plurality of bonded structures;

the initiation in step e) takes place when the hot region of the bonded structure reaches a temperature between 150° C. and 250° C.;

the weakening thermal budget is between 40% and 95% of a splitting thermal budget, the splitting thermal budget being that which leads to spontaneous initiation of the splitting wave in the buried weakened plane during the anneal;

the stress applied at the periphery of the bonded structure by inserting a wedge at the bonding interface of the bonded structure, between chamfered edges of the donor substrate and of the carrier substrate, respectively, of the bonded structure; and the donor substrate and the carrier substrate are made of monocrystalline silicon, and wherein the buried weakened plane is formed by ion implantation of light species into the donor substrate, the light species being chosen from hydrogen and helium, or a combination of hydrogen and helium.

BRIEF DESCRIPTION OF THE DRAWINGS

Other features and advantages of the present disclosure will become apparent from the following detailed description of embodiments of the present disclosure, which description is given with reference to the accompanying figures, in which.

DETAILED DESCRIPTION

Figure 2:
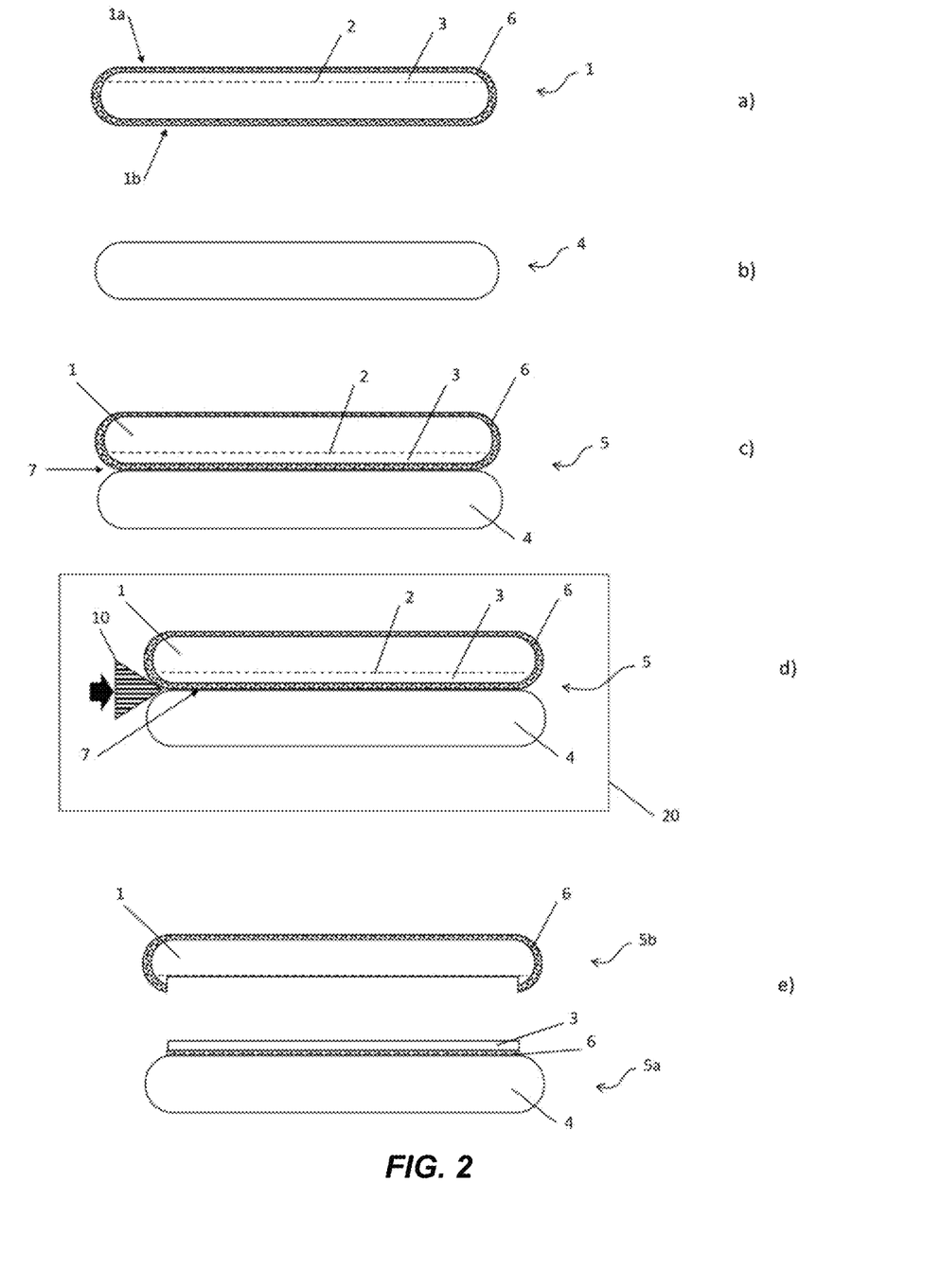
FIG. 2 shows a transfer process according to the present disclosure.

In the description, the same reference signs in the figures might be used for elements of the same type. The figures are schematic representations, which, for the sake of legibility, are not to scale. In particular, the thicknesses of the layers along the z-axis are not to scale with respect to the lateral dimensions along the x- and y-axes; and the relative thicknesses of the layers with respect to one another are not necessarily respected in the figures. It should be noted that the coordinate system (x,y,z) of FIG. 1 applies to FIG. 2.

The present disclosure relates to a process for transferring a useful layer 3 to a carrier substrate 4. The useful layer 3 is named as such because it is intended for use in the production of components in the fields of microelectronics or microsystems. The useful layer and the carrier substrate may vary in nature depending on the target component type and target application. Since silicon is currently the most commonly used semiconductor material, the useful layer and the carrier substrate may be made of, in particular, monocrystalline silicon, but are, of course, not limited to this material.

The transfer process according to the present disclosure first comprises a step a) of providing a donor substrate 1, from which the useful layer 3 will be taken. The donor substrate 1 includes a buried weakened plane 2 (FIG. 2-a)). The latter is advantageously formed by ion-implanting light species into the donor substrate 1 at a defined depth. The light species are chosen, preferably, from hydrogen and helium, or a combination of hydrogen and helium, since these species promote the formation of microcavities around the defined implantation depth, resulting in the buried weakened plane 2.

The useful layer 3 is delimited by a front face 1a of the donor substrate 1 and the buried weakened plane 2.

The donor substrate 1 may be formed of at least one material chosen from silicon, germanium, silicon carbide, IV-IV, III-V or II-VI semiconductor compounds and piezoelectric materials (for example, $LiNbO_3$, $LiTaO_3$, etc.). It may further include one or more surface layers arranged on the front face 1a and/or on the back face 1b thereof, which may be of any nature, for example, dielectric.

The transfer process also comprises a step b) of providing a carrier substrate 4 (FIG. 2-b)).

The carrier substrate may be formed, for example, of at least one material chosen from the silicon, silicon carbide, glass, sapphire, aluminum nitride or any other material that might be available in substrate form. It may also include one or more surface layers of any nature, for example, dielectric.

As mentioned above, one advantageous application of the transfer process according to the present disclosure is the production of SOI substrates. In this particular case, the donor substrate 1 and the carrier substrate 4 are made of monocrystalline silicon, and either or both of the substrates include a surface layer of silicon oxide 6 on the front face thereof.

The transfer process next comprises a step c) of joining the donor substrate 1, by its front face 1a, to the carrier substrate 4 along a bonding interface 7 so as to form a bonded structure 5 (FIG. 2-c)).

The joining operation may be carried out using any known method, in particular, by direct bonding by molecular adhesion, by thermocompression, by electrostatic bonding, etc. These well-known prior-art techniques will not be described in detail here. However, it is recalled that, prior to joining, the donor substrate 1 and the carrier substrate 4 will have undergone surface-activation and/or cleaning sequences in order to ensure the quality of the bonding interface 7 in terms of defects and bonding energy.

In the transfer process according to the present disclosure, a step d) of annealing the bonded structure 5 is then carried out in order to apply a weakening thermal budget to the bonded structure 5 and to bring the buried weakened plane to a defined level of weakening (FIG. 2-d)). The time/temperature pairs applied during the anneal determine the thermal budget to which the bonded structure 5 is subjected.

The range of temperatures over which the anneal may be carried out for this operation of weakening the buried plane 2 depends primarily on the type of bonded structure 5 (homostructure or heterostructure) and on the nature of the donor substrate 1.

By way of example, in the case of a donor substrate 1 and a carrier substrate 4 made of silicon, the anneal in step d) reaches a maximum hold temperature that is typically between 200° C. and 600° C., advantageously between 300° C. and 500° C. and even more advantageously between 350° C. and 450° C. More generally, the maximum hold temperature could, for materials used for the donor substrate 1 and/or for the carrier substrate 4 other than silicon, typically be between 200° C. and 800° C.

The anneal may include a temperature ramp-up (typically between 200° C. and the maximum hold temperature) and a hold at the maximum temperature. In general, the duration of such an anneal will be between a few tens of minutes and several hours, depending on the maximum hold temperature of the anneal.

The level of weakening of the buried weakened plane 2 is defined by the area occupied by the microcavities present in the buried weakened layer 2. In the case of a donor substrate 1 made of silicon, this area occupied by the microcavities may be characterized by infrared microscopy.

The level of weakening may range from a low level (<1%, below the detection threshold of the characterizing instruments) up to more than 80%, depending on the thermal budget applied to the bonded structure 5 during the anneal.

The weakening thermal budget is always kept below a splitting thermal budget for which spontaneous initiation of the splitting wave in the buried weakened plane 2 is obtained during the anneal. Preferably, the weakening thermal is between 40% and 95% of the splitting thermal budget.

It should be noted that the heat treatment apparatus 20 in which the anneal in step d) is performed is, preferably, a horizontally or vertically configured oven, suitable for batch-treating a plurality of bonded structures 5.

In the transfer process according to the present disclosure, a step e) of initiating a splitting wave along the buried weakened plane 2 is next carried out by applying a stress to the bonded structure 5 (FIG. 2-e)). After initiation, the splitting wave propagates in a self-sustained manner, resulting in the separation of the bonded structure 5 at the buried weakened plane 2. Self-sustained propagation means that once initiated, the spitting wave propagates by itself, without the application of external stress, throughout the entire extent of the buried weakened plane 2, so that the useful layer 3 is completely detached from the donor substrate 1 and transferred to the carrier substrate 4. A transferred assembly 5a and the remainder 5b of the donor substrate 1 are thus obtained (FIG. 2-f)).

Advantageously, the stress is local and applied at the periphery of the bonded structure 5. It may be caused mechanically or by any other means, such as, for example, local heating by means of a laser or energy transfer by means of ultrasound.

Preferably, a local mechanical load may be applied by inserting a wedge at the bonding interface 7 of the bonded structure 5, between chamfered edges of the donor substrate 1 and of the carrier substrate 4, respectively, of the bonded structure 5. This results in tensile strain being generated in the buried weakened plane 2.

It is recalled that, by applying the transfer process of the prior art mentioned in the introduction, which involves mechanically initiating the splitting wave at ambient temperature, the applicant has observed marbling-like irregular patterns that negatively affect the uniformity of thickness of the useful layer 3 after transfer. The applicant has identified that these irregular patterns are related to an instability in the propagation of the splitting wave due to insufficient energy stored in the [bonded structure 5/buried weakened layer 2] system.

To overcome these problems and to improve the uniformity of thickness of the useful layer 3 after transfer, the transfer process according to the present disclosure envisages that the splitting wave is initiated, in step e), by applying an external stress to the buried weakened plane 2 when the bonded structure 5 is experiencing a thermal gradient defining a hot region and a cool region of the bonded structure 5. According to the present disclosure, the external stress is applied locally in the cool region of the bonded structure 5. The maximum temperature experienced by the hot region is always lower than the maximum hold temperature of the anneal.

Advantageously, the initiation in step e) is chosen to take place when the bonded structure 5 is experiencing a thermal gradient that is larger than 20° C. and smaller than 100° C., in particular, between 60° C. and 90° C., preferably, about 80° C.

This particular configuration makes it possible to limit variations in the thickness of the useful layer 3, which may appear in the form of regular or irregular patterns with an amplitude of about a nanometer or half a nanometer.

Specifically, it has been identified that the non-uniformities of thickness caused by the propagation of the splitting wave may have two distinct origins: first, excess energy released at the start of propagation (creating regular patterns with a pitch of about 1 cm); second, a lack of energy released at the end of propagation, generating instability in the split (resulting in an irregular pattern). Now, the energy released by splitting is directly proportional to the temperature of the material in which it propagates. Thus, if it is initiated in the hot region of the bonded structure 5, the split will initially release a lot of energy (which is disadvantageous in terms of regular patterns) and then, at the end of propagation, release less energy (which is disadvantageous in terms of irregular patterns). By initiating in the cool region of the bonded structure 5, the split initially releases little energy (which is advantageous in terms of regular patterns) then, at the end of propagation, releases more energy (which is advantageous in terms of irregular patterns).

Figure 3A:
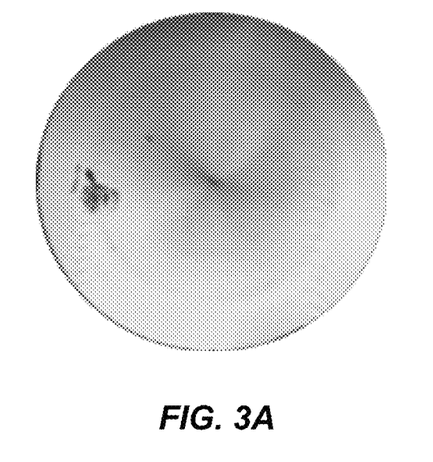
FIGS. 3a and 3b show haze maps at the surface of useful layers including non-uniformities of thickness after transfer.
Figure 3B:
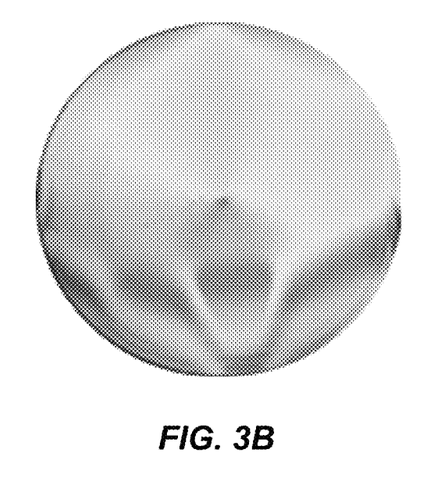

By way of example, FIGS. 3a and 3b show haze maps of useful layers 3 after, respectively, spontaneous splitting taking place during annealing and mechanical splitting initiated at ambient temperature after a weakening anneal. It should be noted that the aforementioned mechanical splitting operation was initiated by applying a local mechanical load to the bonded structure 5 and generating strain in the buried weakened layer 2. In each case, (regular or irregular) patterns, which negatively affect the uniformity of thickness of the useful layer 3 after transfer (between 0.5 nm and 1.5 nm in amplitude), are observed. These patterns have been made apparent by measurement of haze, which corresponds to the intensity of the light scattered by the surface of the useful layer 3, using the SURF SCAN™ inspection tool by KLA-Tencor. In FIG. 3a (spontaneous splitting), regular, periodic patterns with a wavelength of about 2 cm give rise to a local non-uniformity in the haze signal of 4%. In FIG. 3b (mechanical splitting at ambient temperature), irregular patterns give rise to a local non-uniformity in the haze signal of more than 12%.

Figure 4:
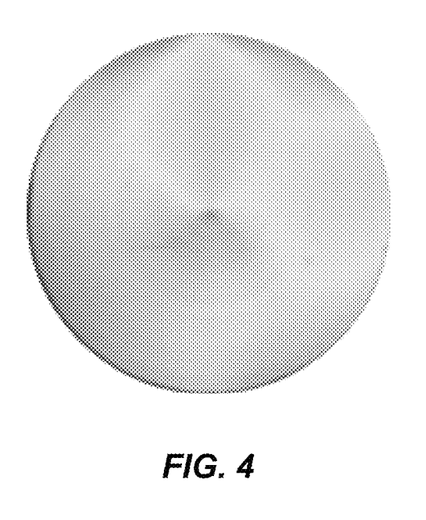
FIG. 4 shows a haze map at the surface of a useful layer transferred using a transfer process according to the present disclosure.

FIG. 4 shows a haze map at the surface of a useful layer 3 transferred using a transfer process according to the present disclosure: in this instance, after splitting is initiated when the bonded structure 5 is experiencing a thermal gradient of about 80° C. by applying a local mechanical load to the cool region of the bonded structure 5, generating strain in the buried weakened plane 2. No pattern, whether regular or irregular and marbling-like, is present, and the local non-uniformity in the haze signal does not exceed 2%. The uniformity of thickness of the useful layer 3 is thus substantially improved.

Generally speaking, a splitting wave initiated in the cool region of the bonded structure 5, when there is a thermal gradient larger than 20° C. and smaller than 100° C. across the bonded structure 5, leads to a high degree of uniformity of thickness for the useful layer 3 after transfer.

Figure 5:
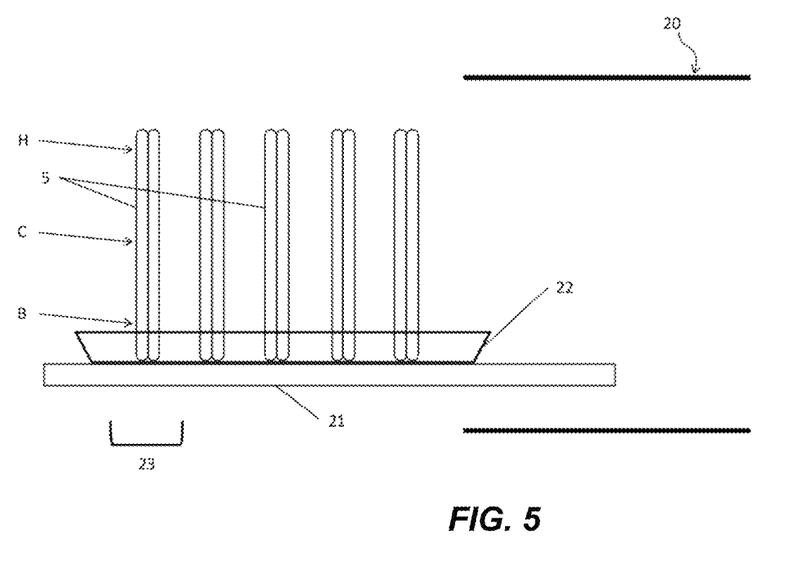
FIG. 5 shows a step in a transfer process according to the present disclosure.
Figure 6:
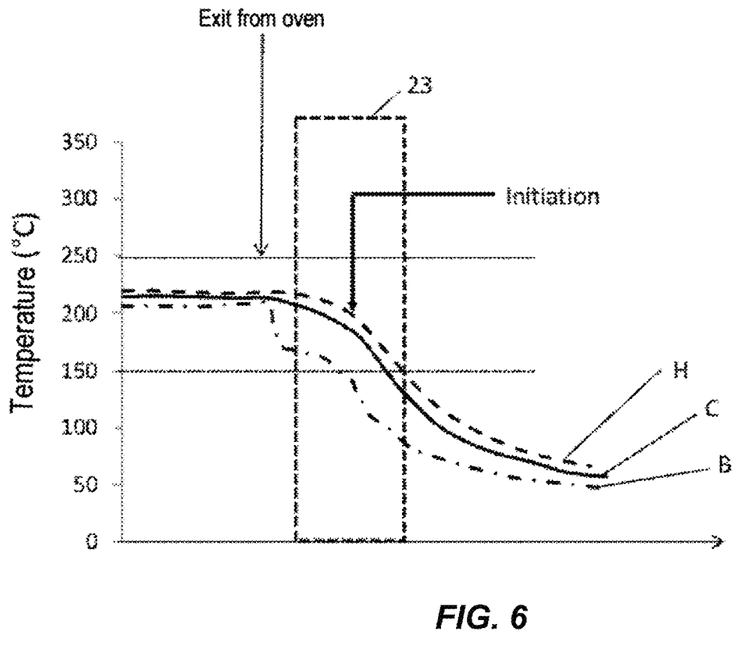
FIG. 6 is a graph showing the variation in the temperatures and in the thermal gradient seen by a bonded structure in a step in a transfer process according to the present disclosure.

According to one advantageous embodiment of the present disclosure, the splitting wave is initiated when the bonded structure 5 exits the heat treatment apparatus 20 in which the anneal in step d) was performed: there is generally a thermal gradient across the bonded structure 5 when it exits the apparatus (FIGS. 5 and 6). This gradient is generally due to the geometry of the oven 20 and the presence of a system for holding the bonded structures 5, which affects heat dissipation. For example, in the case of a horizontally configured oven 20 in which the bonded structures 5 are placed vertically into cassettes 22 that are borne by a charge shovel 21, it is observed that the lower region B (cod region) of the bonded structures 5 (i.e., that closest to the holding system formed by the cassette 22 and the charge shovel 21) is cooler than the upper region H of the bonded structures 5. The local mechanical load is then applied in the lower region B (cool region) of the bonded structure 5, according to the present disclosure.

Preferably, the initiation in step e) takes place at the exit of the heat treatment apparatus 20 when the hot region of the bonded structure 5 is at a temperature between 150° C. and 250° C., preferably, about 200° C. When the splitting wave is initiated within the aforementioned temperature range, the energy stored in the system (bonded structure 5+buried weakened plane 2), and, in particular, the energy stored in the buried weakened plane 2 due to the presence of pressurized gaseous species in the microcavities, is suitable for effective self-sustained propagation, further improving the surface state of the useful layer 3 after transfer.

Exemplary Application:

The transfer process according to the present disclosure may be used for the production of SOI substrates, the useful layer 3 of which is very thin, in particular, between a few nanometers and 50 nm.

The example used is that of donor substrate 1 and carrier substrate 4 and made of monocrystalline silicon, each taking the form of a 300 mm-diameter wafer. The donor substrate is covered with a layer of silicon oxide 6 with a thickness of 50 nm. The buried weakened plane 2 is formed in the donor substrate 1 by co-implanting hydrogen and helium ions under the following conditions:

H: implantation energy 38 keV, dose 1E16 $H/cm^2$; and
He: implantation energy 25 keV, dose 1E16 $He/cm^2$.

The buried weakened plane 2 is located at a depth of about 290 nm from the front face 1a of the donor substrate 1. It delimits, with the silicon oxide layer 6, a useful layer 3 of about 240 nm.

The donor substrate 1 is joined to the carrier substrate 4 by direct bonding by molecular adhesion, to form the bonded structure 5. Prior to joining, the donor substrate 1 and the carrier substrate 4 will have undergone known surface-activation and/or cleaning sequences in order to ensure the quality of the bonding interface 7 in terms of defects and bonding energy.

Figure 7:
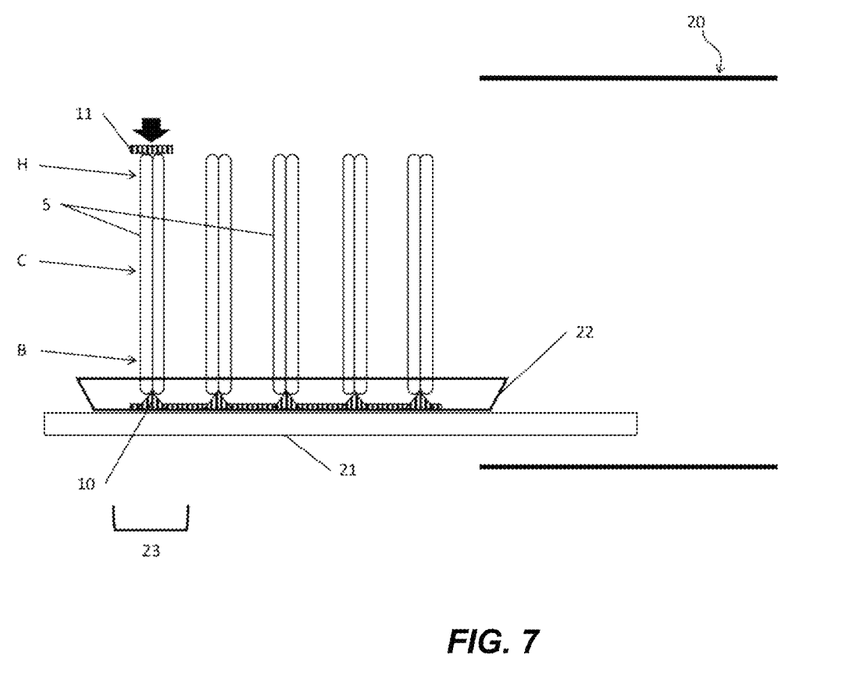
FIG. 7 shows a step in a transfer process according to the present disclosure.

A horizontally configured oven 20 is used to perform the batch-annealing of a plurality of bonded structures 5 such as described above. This type of heat treatment apparatus 20 comprises a charge shovel 21, which bears cassettes 22 into which the bonded structures 5 are placed (FIG. 7). The charge shovel 21 moves between an entered position, in which the bonded structures 5 are inside the oven 20, and an exited position, in which they are outside the oven 20.

A system of wedges 10 may be positioned on each cassette 22, under the bonded structures 5. The charge shovel 21 moves to the entered position for the anneal to be performed. The anneal comprises a temperature ramp-up from 200° C. to 380° C., a hold at 380° C. for two minutes and a temperature ramp-down to 225° C.

Upon completion of the anneal, the charge shovel 21 moves to its exited position.

As illustrated in FIG. 6, as soon as each bonded structure 5 has exited the oven 20, the temperature it experiences decreases and a thermal gradient arises. The cool region of the bonded structure 5 is located in a bottom region B, i.e., close to the charge shovel 21 and the cassette 22. Each bonded structure 5 will move on to an exit zone 23 in which it will experience a thermal gradient that is, preferably, between 60° C. and 90° C., and, in particular, about 80° C.+/−10° C., or even 80° C.+/−5° C. In this exit zone 23, a pressing device 11 located above the bonded structures 5 will exert a pressing force on each bonded structure 5 successively, such that the wedge 10 thereunder (in the cool region) will be inserted, at the bonding interface 7, between the chamfered edges of the joined substrates of the bonded structure 5 (FIG. 7). The insertion of the wedge 10 generates local tensile strain at the site of the buried weakened plane 2, allowing the splitting wave to be initiated in the cool region of each bonded structure 5 in succession as they pass beneath the pressing device 11.

Of course, tools other than the assembly formed by the system of wedges 10 and the pressing device 11 could be implemented to initiate the splitting wave in the bonded structures 5 in accordance with the present disclosure.

The splitting wave is thus initiated for each bonded structure in its cool region (bottom region B) when it is experiencing a thermal gradient of about 80° C. (about 70° C. in the example of FIG. 6).

In the example of FIG. 6, the exit zone 23 in which the initiation of the splitting wave takes place corresponds to a zone in which each bonded structure 5 is subjected, in its coolest region (bottom region B), to a temperature of about 130° C., its central region C experiencing an intermediate temperature of about 180° C. and its top region H experiencing a temperature of about 200° C.

Following the self-sustained propagation of the splitting wave, what is obtained, after transfer, is the SOI substrate (transferred assembly 5a) and the remainder 5b of the donor substrate. A very high degree of uniformity of thickness is obtained for the transferred useful layers 3 (similar to the result of FIG. 4).

Finishing steps applied to the transferred assemblies 5a comprise chemical cleaning operations and at least one high-temperature smoothing heat treatment. Upon completion of these steps, the SOI substrates include a useful layer 3 with a thickness of 50 nm, the final non-uniformity of thickness of which is about 0.45 nm. It should be noted that, in comparison, SOI substrates of which the useful layer 3 includes regular or irregular patterns after splitting may exhibit final non-uniformities of thickness that are greater than or equal to 0.7 nm.

Of course, the present disclosure is not limited to the described implementations and examples, and variant embodiments may be introduced thereinto without departing from the scope of the invention as defined by the claims.

The invention claimed is:

1. A method for transferring a useful layer to a carrier substrate, comprising the following steps:
   a) providing a donor substrate including a buried weakened plane, the useful layer being delimited by a front face of the donor substrate and the buried weakened plane;
   b) providing a carrier substrate;
   c) joining the donor substrate, by its front face, to the carrier substrate along a bonding interface so as to form a bonded structure;
   d) annealing the bonded structure to apply a weakening thermal budget thereto and to bring the buried weakened plane to a defined level of weakening, the anneal reaching a maximum hold temperature; and
   e) initiating a splitting wave in the buried weakened plane by applying a stress to the bonded structure, the splitting wave propagating in a self-sustained manner along the buried weakened plane to result in the useful layer being transferred to the carrier substrate;
   wherein the initiation in step e) takes place when the bonded structure is experiencing a thermal gradient defining a hot region and a cool region of the bonded structure, the stress being applied locally in the cool region, and the hot region experiencing a temperature lower than the maximum hold temperature.

2. The method of claim 1, wherein the thermal gradient is between 20° C. and 100° C.

3. The method of claim 2, wherein the thermal gradient is between 60° C. and 90° C.

4. The method of claim 3, wherein the thermal gradient is about 80° C.

5. The method of claim 2, wherein the maximum hold temperature is between 300° C. and 600° C.

6. The method of claim 5, wherein the annealing step d) takes place in a heat treatment apparatus and the initiation in step e) takes place when the bonded structure exits the heat treatment apparatus.

7. The method of claim 6, wherein the heat treatment apparatus is a horizontally or vertically configured oven, configured for batch-treating a plurality of bonded structures.

8. The method of claim 7, wherein the initiation in step e) takes place when the hot region of the bonded structure reaches a temperature between 150° C. and 250° C.

9. The method of claim 8, wherein the weakening thermal budget is between 40% and 95% of a splitting thermal budget, the splitting thermal budget leading to spontaneous initiation of the splitting wave in the buried weakened plane during the anneal.

10. The method of claim 9, wherein the stress is applied at the periphery of the bonded structure by inserting a wedge at the bonding interface of the bonded structure, between chamfered edges of the donor substrate and of the carrier substrate, respectively, of the bonded structure.

11. The method of claim 10, wherein the donor substrate and the carrier substrate comprise monocrystalline silicon, and wherein the buried weakened plane is formed by ion implantation of light species into the donor substrate, the light species being chosen from among hydrogen and helium, or a combination of hydrogen and helium.

12. The method of claim 1, wherein the maximum hold temperature is between 300° C. and 600° C.

13. The method of claim 1, wherein the annealing step d) takes place in a heat treatment apparatus and the initiation in step e) takes place when the bonded structure exits the heat treatment apparatus.

14. The method of claim 13, wherein the heat treatment apparatus is a horizontally or vertically configured oven, configured for batch-treating a plurality of bonded structures.

15. The method of claim 1, wherein the initiation in step e) takes place when the hot region of the bonded structure reaches a temperature between 150° C. and 250° C.

16. The method of claim 1, wherein the weakening thermal budget is between 40% and 95% of a splitting thermal budget, the splitting thermal budget leading to spontaneous initiation of the splitting wave in the buried weakened plane during the anneal.

17. The method of claim 1, wherein the stress is applied at the periphery of the bonded structure by inserting a wedge at the bonding interface of the bonded structure, between chamfered edges of the donor substrate and of the carrier substrate, respectively, of the bonded structure.

18. The method of claim 1, wherein the donor substrate and the carrier substrate comprise monocrystalline silicon, and wherein the buried weakened plane is formed by ion implantation of light species into the donor substrate, the light species being chosen from among hydrogen and helium, or a combination of hydrogen and helium.

* * * * *

UNITED STATES PATENT AND TRADEMARK OFFICE
CERTIFICATE OF CORRECTION

| | |
|---|---|
| PATENT NO. | : 11,876,015 B2 |
| APPLICATION NO. | : 17/435631 |
| DATED | : January 16, 2024 |
| INVENTOR(S) | : Didier Landru et al. |

It is certified that error appears in the above-identified patent and that said Letters Patent is hereby corrected as shown below:

In the Specification

Column 6, Line 53, change "the SURF SCAN™ inspection" to --the SURFSCAN™ inspection--

Signed and Sealed this
Twelfth Day of March, 2024

Katherine Kelly Vidal
Director of the United States Patent and Trademark Office